United States Patent
Lee et al.

(10) Patent No.: US 8,373,340 B2
(45) Date of Patent: Feb. 12, 2013

(54) ORGANIC ELECTROLUMINESCENT DISPLAY DEVICE

(75) Inventors: Jaedo Lee, Gumi-si (KR); Howon Choi, Daegu (KR); Younghee Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 12/588,770

(22) Filed: Oct. 27, 2009

(65) Prior Publication Data

US 2010/0244682 A1 Sep. 30, 2010

(30) Foreign Application Priority Data

Mar. 27, 2009 (KR) .................. 10-2009-0026633

(51) Int. Cl.
*H01J 1/62* (2006.01)
*H01J 63/04* (2006.01)
(52) U.S. Cl. ...................... 313/504; 313/512
(58) Field of Classification Search .................. 313/504, 313/512; 349/58
See application file for complete search history.

(56) References Cited

U.S. PATENT DOCUMENTS

| 2004/0080267 A1* | 4/2004 | Cok ................................ 313/512 |
| 2007/0165009 A1* | 7/2007 | Sakurai et al. ................. 345/177 |
| 2007/0200487 A1* | 8/2007 | Uno ................................ 313/500 |
| 2008/0067933 A1* | 3/2008 | Wang et al. .................... 313/512 |
| 2008/0068342 A1* | 3/2008 | Chang et al. ................... 345/173 |
| 2009/0033824 A1* | 2/2009 | Nishikawa et al. ............. 349/58 |
| 2009/0213092 A1* | 8/2009 | Kuo et al. ....................... 345/174 |
| 2009/0231500 A1* | 9/2009 | Ha et al. ........................... 349/12 |
| 2009/0231507 A1* | 9/2009 | Oohira ............................. 349/58 |

FOREIGN PATENT DOCUMENTS

| CN | 101004655 | 7/2007 |
| CN | 101946271 | 1/2011 |
| JP | 2002156920 | 5/2002 |
| JP | 2007086504 | 4/2007 |
| JP | 2008171011 | 7/2008 |
| JP | 2009037183 | 2/2009 |

* cited by examiner

*Primary Examiner* — Anh Mai
*Assistant Examiner* — Michael Santonocito
(74) *Attorney, Agent, or Firm* — McKenna Long & Aldridge, LLP (57) ABSTRACT

An embodiment of this document provides an organic electroluminescent display device, comprising a panel, a polarization plate disposed over the panel, a cover window disposed on the polarization plate, and a support member configured to form an air layer between the panel and the polarization plate.

2 Claims, 6 Drawing Sheets

ORGANIC ELECTROLUMINESCENT DISPLAY DEVICE

This application claims the benefit of Korean Patent Application No. 10-2009-026633 filed on Mar. 27, 2009, which is hereby incorporated by reference.

BACKGROUND OF THE INVENTION

1. Field of the Invention

An embodiment of this document relates to an organic electroluminescent display device.

2. Discussion of the Related Art

An organic electroluminescent element used in an organic electroluminescent display device is an emissive element in which an emission layer is formed between two electrodes disposed on a substrate. The organic electroluminescent display device comprises a top-emission method, a bottom-emission method, a dual-emission method, etc. according to a direction in which light is emitted. The organic electroluminescent display device is divided into a passive matrix-type method, an active matrix-type method according to a driving method.

Each of subpixels arranged in the organic electroluminescent display device comprises a transistor unit comprising a switching transistor, a driving transistor, and a capacitor, a lower electrode coupled to the driving transistor included in the transistor unit, and an organic light-emitting diode comprising an organic light-emitting layer and an upper electrode.

In the organic electroluminescent display device, when a scan signal, a data signal, power, etc. are supplied to a plurality of the subpixels arranged in a matrix form, selected subpixels emit light, thereby displaying an image.

SUMMARY OF THE INVENTION

An embodiment of this document provides an organic electroluminescent display device, comprising a panel, a polarization plate disposed over the panel, a cover window disposed on the polarization plate, and a support member configured to form an air layer between the panel and the polarization plate.

In an aspect, an embodiment of this document provides an organic electroluminescent display device comprises a panel, a polarization plate disposed over the panel, a touch panel disposed on the polarization plate, a cover window disposed on the touch panel, and a support member configured to form an air layer between the panel and the polarization plate.

In another aspect, an embodiment of this document provides an organic electroluminescent display device, comprising a panel, a touch panel disposed on the panel, a polarization plate disposed over the touch panel, a cover window disposed on the polarization plate, and a support member configured to form an air layer between the touch panel and the polarization plate.

BRIEF DESCRIPTION OF THE DRAWINGS

The accompanying drawings, which are included to provide a further understanding of the invention and are incorporated on and constitute a part of this specification illustrate embodiments of the invention and together with the description serve to explain the principles of the invention.

DETAILED DESCRIPTION OF THE ILLUSTRATED EMBODIMENTS

Reference will now be made in detail embodiments of this document examples of which are illustrated in the accompanying drawings.

Detailed embodiments of this document are described below with reference to the accompanying drawings.

An organic electroluminescent display device comprises a panel having a plurality of subpixels arranged thereon in a matrix form and a driving unit configured to supply the panel with driving signals including a scan signal, a data signal, etc. Each of the subpixels included in the panel may comprise a transistor unit, comprising a switching transistor, a driving transistor, and a capacitor, and an organic light-emitting diode coupled to the transistor unit. The subpixel may have a different construction of the transistor unit and a different construction of the organic light-emitting diode according to its driving method. In general, the switching transistor may function as a switch according to the scan signal, the driving transistor may activate the organic light-emitting diode in response to the data signal, and the capacitor may store the data signal as a data voltage. Further, the organic light-emitting diode may emit light when the driving transistor operates.

Hereafter, the construction of a subpixel included in the pixel of an organic electroluminescent display device is described below with reference to a cross-sectional view.

Figure 1:
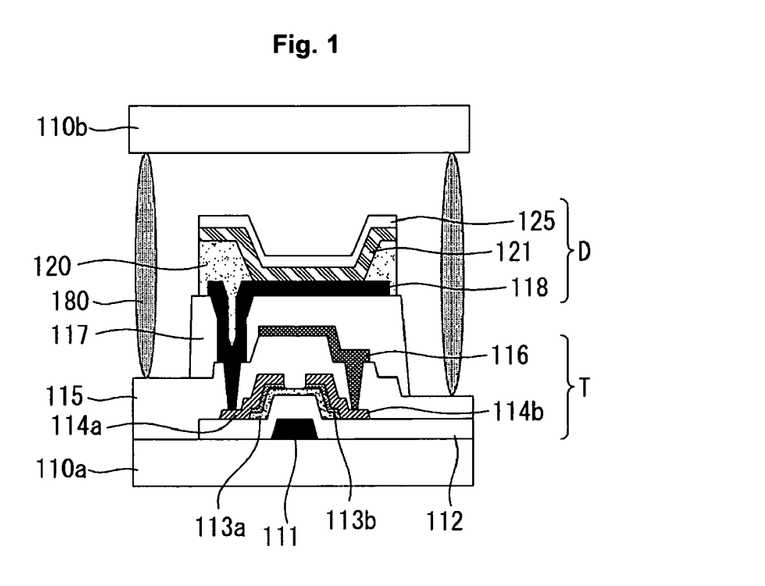
FIG. 1 is a cross-sectional view showing the construction of a subpixel.

The subpixel shown in FIG. 1 comprises a driving transistor T, included in a transistor unit, and an organic light-emitting diode D coupled to the driving transistor T. The constructions of the driving transistor T and the organic light-emitting diode D are described below.

A gate 111 may be disposed on one side of the first substrate 110a. The gate 111 may be made of one selected from the group consisting of molybdenum (Mo), aluminum (Al), chrome (Cr), gold (Au), titanium (Ti), nickel (Ni), neodymium (Nd), and copper (Cu), or an alloy thereof. Alternatively, the gate 111 may be either a single layer, selected from the group consisting of molybdenum (Mo), aluminum (Al), chrome (Cr), gold (Au), titanium (Ti), nickel (Ni), neodymium (Nd), and copper (Cu), or a multilayer formed of an alloy thereof. Alternatively, the gate 111 may be a dual layer of Mo/Al—Nd or Mo/Al.

A first insulating layer 112 may be disposed on the gate 111. The first insulating layer 112 may be a single layer, made of silicon oxide (SiOx) or silicon nitride (SiNx), or a multilayer thereof, but not limited thereto.

An active layer 113a may be disposed on the first insulating layer 112. The active layer 113a may comprise amorphous silicon or polycrystalline silicon which is crystallized amorphous silicon, but not limited thereto. The active layer 113a may comprise a source area, a channel area, and a drain area. An ohmic contact layer 113b may be disposed on the active layer 113a.

A source 114a and a drain 114b, respectively coupled to the source area and the drain area, may be disposed on the active layer 113b. The source 114a and the drain 114b may be formed of a single layer or a multilayer. When the source 114a and the drain 114b have a single layer, the source 114a and the drain 114b may be made of any one selected from the group consisting of molybdenum (Mo), aluminum (Al), chrome (Cr), gold (Au), titanium (Ti), nickel (Ni), neodymium (Nd), and copper (Cu), or an alloy thereof. When the source 114a and the drain 114b have a multilayer, the source 114a and the drain 114b may be formed of a dual layer of Mo/AlNd or a triple layer of Mo/Al/Mo or Mo/AlNd/Mo.

A second insulating layer 115 may be disposed on the source 114a and the drain 114b. The second insulating layer 115 may be formed of a single layer, such as silicon oxide (SiOx) or silicon nitride (SiNx), or a multilayer thereof, but not limited thereto.

A shield metal 116 may be disposed on the second insulating film 115. The shield metal 116 may be coupled to the source 114a or the drain 114b. The shield metal 116 may function to protect the transistor from external interference.

A third insulating layer 117 may be disposed on the second insulating layer 115. The third insulating layer 117 may be formed of a single layer, such as silicon oxide (SiOx) or silicon nitride (SiNx), or a multi-layer thereof, but not limited thereto.

A lower electrode 118 coupled to the source 114a or the drain 114b may be disposed on the third insulating film 117. The lower electrode 118 may function as a cathode or an anode. When the lower electrode 118 functions as the cathode, the cathode may be made of any one selected from aluminum (Al), an Al alloy, and AlNd, but not limited thereto. When the lower electrode 118 functions as the cathode, it is advantageous to form the cathode using material having a high reflectance.

Bank layers 120 may be disposed on the lower electrode 118. The bank layer 120 has an opening unit through which some of the lower electrode 118 is exposed. The bank layer 120 may be made of an organic material, such as benzocyclobutene (BCB) resin, acrylic resin, or polyimide resin, but not limited thereto.

An organic light-emitting layer 121 may be disposed on the lower electrode 118. The organic light-emitting layer 121 may comprise a hole injection layer, a hole transport layer, an emission layer, an electron transport layer, and an electron injection layer. The hole injection layer may function to make smooth the injection of holes. The hole injection layer may be made of one or more selected from the group consisting of CuPc (cupper phthalocyanine), PEDOT (poly(3,4)-ethylenedioxythiophene), PANI (polyaniline), and NPD (N,N-di-naphthyl-N,N'-diphenyl benzidine), but not limited thereto. The hole transport layer may function to make smooth the transport of holes. The hole transport layer may be made of one or more selected from the group consisting of NPD (N,N-dinaphthyl-N,N'-diphenyl benzidine), TPD (N,N'-bis-(3-methylphenyl)-N,N'-bis-(phenyl)-benzidine), s-TAD, and MTDATA (4,4',4"-Tris(N-3-methylphenyl-N-phenyl-amino)-triphenylamine), but not limited thereto. The emission layer may comprise material that emits red, green, blue, or white light or may be made of a phosphorescent or fluorescent material. When the emission layer is made of material that emits red light, the emission layer may be made of a phosphorescent material, comprising a host material having carbazole biphenyl (CBP) or 1,3-bis(carbazol-9-yl) mCP and a dopant having one or more selected from the group consisting of PIQIr (acac)(bis(1-phenylisoquinoline)acetylacetonate iridium), PQIr (acac)(bis(1-phenylquinoline)acetylacetonate iridium), PQIr (tris(1-phenylquinoline)iridium), and PtOEP (octaethylporphyrin platinum). Alternatively, the emission layer may be made of a fluorescent material comprising PBD:Eu(DBM)3(Phen) or Perylene, but not limited thereto. When the emission layer is made of material that emits blue light, the emission layer may be made of a phosphorescent material, comprising a host material having CBP or mCP and a dopant material having (4,6-F2 ppy)2Irpic. Alternatively, the emission layer may be made of a fluorescent material comprising any one selected from the group consisting of spiro-DPVBi, spiro-6P, distryrylbenzene (DSB), distyrylarylene (DSA), PFO polymer, and PPV polymer, but not limited thereto. The electron transport layer may function to make smooth the transport of electrons. The electron transport layer may be made of one or more selected from the group consisting of Alq3(tris(8-hydroxyquinolino)aluminum), PBD, TAZ, Spiro-PBD, BAlq, and SAlq, but not limited thereto. The electron injection layer may function to make smooth the injection of electrons. The electron injection layer may be made of Alq3(tris(8-hydroxyquinolino)aluminum), PBD, TAZ, spiro-PBD, BAlq or SAlq, but not limited thereto. The embodiments of this document are not limited to the above examples, and at least one of the hole injection layer, the hole transport layer, the electron transport layer, and the electron injection layer may be omitted. Alternatively, a layer for adjusting the balance of holes and electrons may be further included, if necessary.

An upper electrode 125 may be disposed on the organic light-emitting layer 121. The upper electrode 125 may function as an anode or a cathode. Here, the upper electrode 125 functioning as the anode may be made of any one selected from the group consisting of ITO (Indium Tin Oxide), IZO (Indium Zinc Oxide), ITZO (Indium Tin Zinc Oxide), and AZO (ZnO doped $Al_2O_3$), but not limited thereto.

The subpixel formed on the first substrate 110a as described above comprises a second substrate 110b opposite to the first substrate 110a because it is vulnerable to moisture or oxygen. A sealant, etc. is coated between the first and second substrates so that they coalesce with each other and are then sealed, thereby completing the panel.

In the organic electroluminescent display device according to the embodiment of this document, in order to improve the picture quality, a polarization plate and a cover window are adhered to the panel, or a touch panel, together with the polarization plate and the cover window, is adhered to the panel.

Hereinafter, organic electroluminescent display devices according to embodiments of this document are described.

First Embodiment

Figure 2:
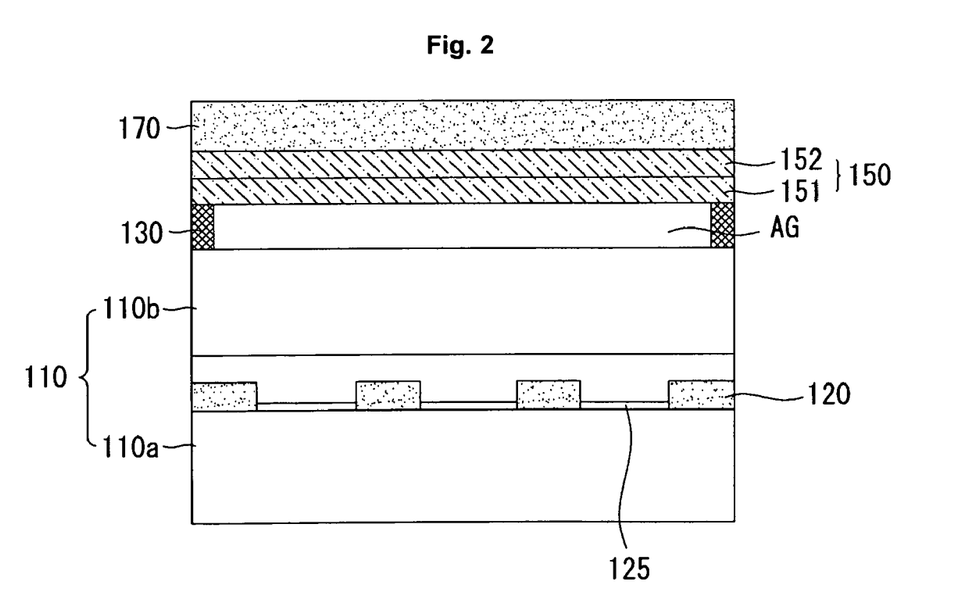
FIG. 2 is a cross-sectional view of an organic electroluminescent display device according to a first embodiment of this document.

Referring to FIG. 2, an organic electroluminescent display device according to a first embodiment of this document may comprise a panel 110, a polarization plate 150, and a cover window 170.

The panel 110 comprises a plurality of the subpixels arranged in a matrix form between the first substrate 110a and the second substrate 110b, as described above with reference to FIG. 1. In the panel 110, "120" denotes the bank layers and "125" denotes the upper electrode.

The polarization plate 150 may comprise a phase delay film 151, disposed over the second substrate 110b included in the panel 110, and a polarization film 152 disposed on the phase delay film 151.

The cover window 170 may be adhered to the polarization film 152 included in the polarization plate 150 and may be made of material, such as plastic, glass, or a film, but not limited thereto. The polarization plate 150 and the cover window 170 may be adhered together using a double-sided adhesive, and the fronts sides of the polarization plate 150 and the cover window 170 are adhered together using the adhesive.

In the first embodiment, an example is given in which the polarization plate 150 and the cover window 170 are adhered to the panel 110 in order to improve the picture quality of the organic electroluminescent display device. Here, the panel 110 and the polarization plate 150 are attached together by a support member 130. The support member 130 forms an air layer AG between the panel 110 and the polarization plate 150.

Second Embodiment

Figure 3:
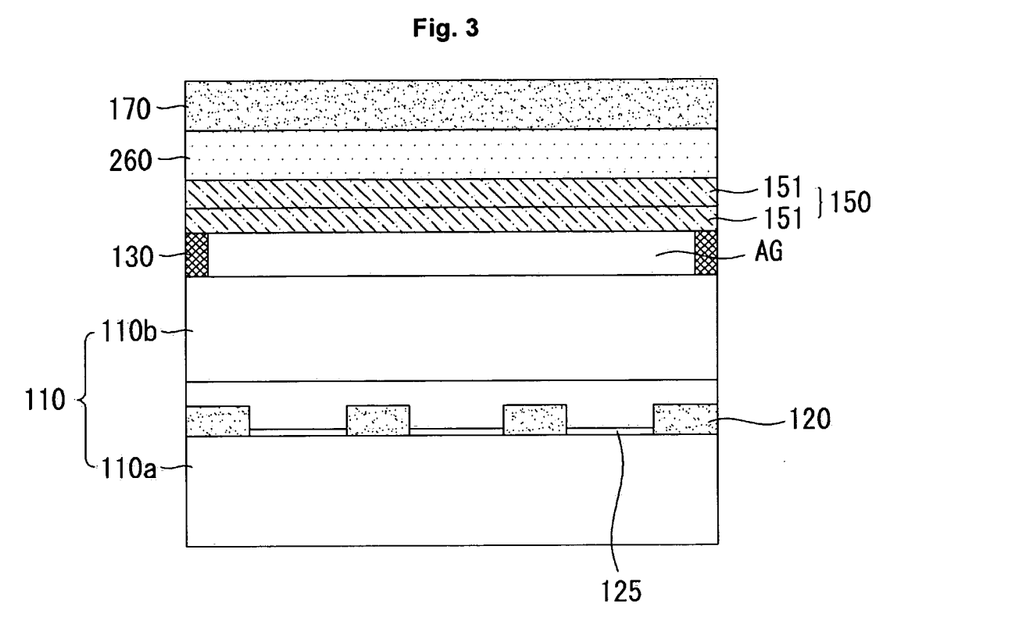
FIG. 3 is a cross-sectional view of an organic electroluminescent display device according to a second embodiment of this document.

Referring to FIG. 3, an organic electroluminescent display device according to a second embodiment of this document may comprise a panel 110, a polarization plate 150, a touch panel 260, and a cover window 170.

The panel 110 comprises a plurality of the subpixels arranged in a matrix form between the first substrate 110a and the second substrate 110b, as described above with reference to FIG. 1. In the panel 110, "120" denotes the bank layers and "125" denotes the upper electrode.

The polarization plate 150 may comprise a phase delay film 151, disposed over the second substrate 110b included in the panel 110, and a polarization film 152 disposed on the phase delay film 151.

The cover window 170 may be attached to the touch panel 260 and may be made of material, such as plastic, glass, or a film, but not limited thereto. The touch panel 260 and the cover window 170 may be adhered together using a double-sided adhesive, and the fronts sides of the touch panel 260 and the cover window 170 are adhered together using the adhesive.

In the second embodiment, an example is given in which the polarization plate 150, the touch panel 260, and the cover window 170 are adhered to the panel 110 in order to improve the picture quality of the organic electroluminescent display device and receive a user's touch input. Here, the panel 110 and the polarization plate 150 are attached together by a support member 130. The support member 130 forms an air layer AG between the panel 110 and the polarization plate 150.

Third Embodiment

Figure 4:
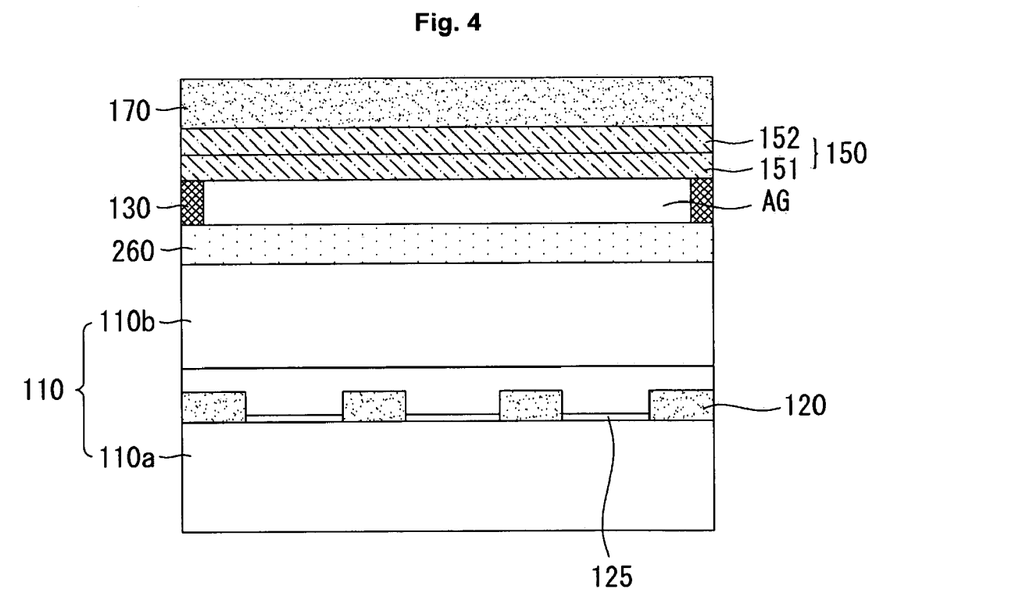
FIG. 4 is a cross-sectional view of an organic electroluminescent display device according to a third embodiment of this document.

Referring to FIG. 4, an organic electroluminescent display device according to a third embodiment of this document may comprise a panel 110, a touch panel 260, a polarization plate 150, and a cover window 170.

The panel 110 comprises a plurality of the subpixels arranged in a matrix form between the first substrate 110a and the second substrate 110b, as described above with reference to FIG. 1. In the panel 110, "120" denotes the bank layers and "125" denotes the upper electrode.

The polarization plate 150 may comprise a phase delay film 151, disposed over the second substrate 110b included in the panel 110, and a polarization film 152 disposed on the phase delay film 151.

The cover window 170 may be attached to the touch panel 260 and may be made of material, such as plastic, glass, or a film, but not limited thereto. The touch panel 260 and the cover window 170 may be adhered together using a double-sided adhesive, and the fronts sides of the touch panel 260 and the cover window 170 are adhered together using the adhesive.

In the third embodiment, an example is given in which the touch panel 260, the polarization plate 150, and the cover window 170 are attached to the panel 110 in order to improve the picture quality of the organic electroluminescent display device and receive a user's touch input. Here, the touch panel 260 and the polarization plate 150 are attached together by a support member 130. The support member 130 forms an air layer AG between the touch panel 260 and the polarization plate 150.

The touch panel 260 described in connection with the second and third embodiments may comprise a resistive touch panel or a capacitive touch panel. The constructions of the resistive touch panel and the capacitive touch panel may be constructed as follows.

Figure 5:
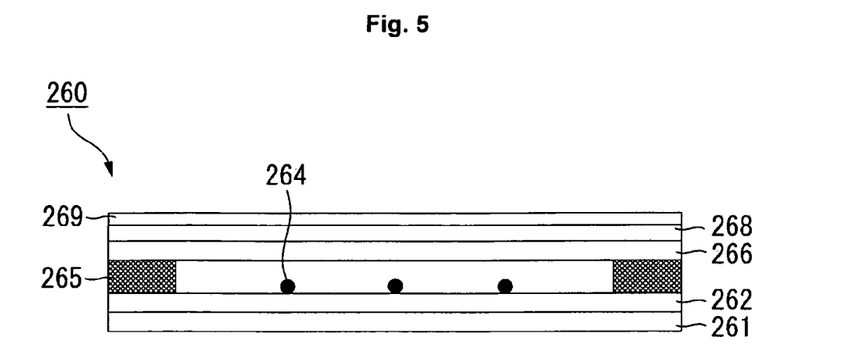
FIG. 5 is an exemplary view showing a schematic construction of a resistive touch panel.

Referring to FIG. 5, the resistive touch panel 260 may comprise two films 261 and 268 respectively comprising conductive electrodes 262 and 266 opposite to each other, spacers 264 configured to separate the conductive electrodes 262 and 266 from each other, a first adhesive 265 configured to adhere the two films 261 and 268 together, and a second adhesive 269 disposed on the upper film 268. The resistive touch panel 260 constructed as above may detect a position touched by a user using a control unit configured to receive a resistance value which varies according to a user's touch.

Figure 6:
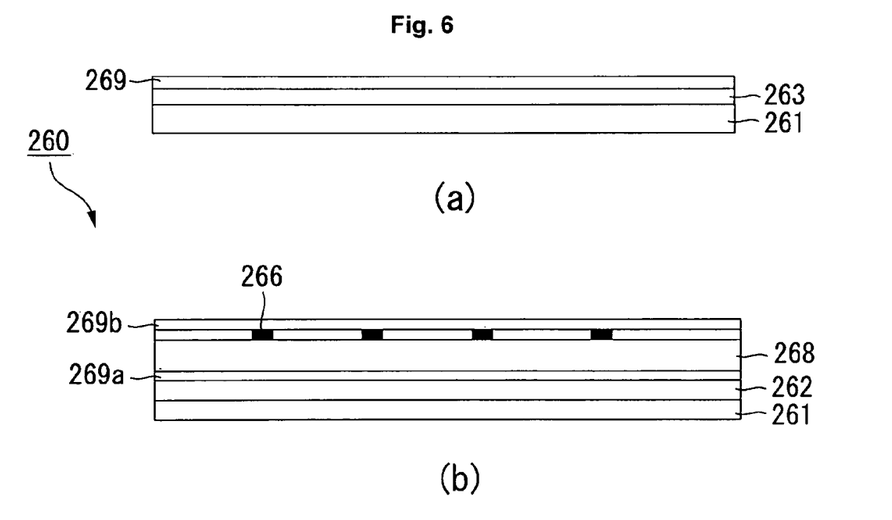
FIG. 6 is an exemplary view showing a schematic construction of a capacitive touch panel.

Referring to (a) of FIG. 6, a single layer-type capacitive touch panel 260 may comprise an electrode 263 formed of a single layer on a film 261 and an adhesive 269 disposed on the electrode 263. The capacitive touch panel has a simple structure unlike the resistive touch panel. On the other hand, Referring to (b) of FIG. 6, a double layer-type capacitive touch panel 260 may comprise a first transparent electrode 262 disposed on a lower film 261, a first adhesive 269a disposed on the first transparent electrode 262, an upper film 268 disposed on the first adhesive 269a, a second transparent electrode 266 disposed on the upper film 268, and a second adhesive 269b disposed on the second transparent electrode 266. The capacitive touch panel 260 constructed as above can detect a position touched by a user using a control unit configured to receive a dielectric constant which varies according to the user's touch.

The support member 130 described above in connection with the first to third embodiments may have the following construction in order to form the air layer AG when the polarization plate 150 is attached.

Figure 7:
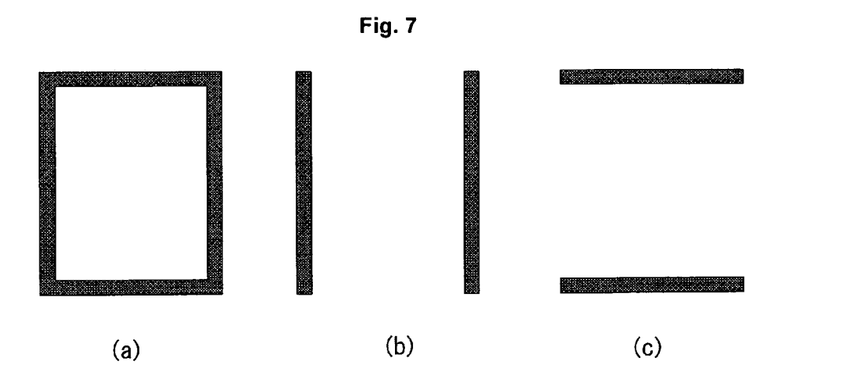
FIG. 7 is an exemplary view showing the construction of a support member.

Referring to (a) of FIG. 7, the support member 130 may comprise a single double-sided adhesive member having a closed curve shape along the outer edge of the polarization plate 150. Unlike the above, the support member 130 may comprise two double-sided adhesive members so that they correspond to each other along the outer edge of the polarization plate 150, as shown in (b) or (c) of FIG. 7.

In the known art, reflectance can be reduced using a filter comprising super view resin (SVR) or an optical clear adhesive (OCA) having a similar refractive index (n≈1.5) to a cover window, a touch panel, and a panel (a substrate made of glass). However, the conventional method using the filler requires an additional process of performing SVR or OCA and results in an increased cost. Further, the conventional method is problematic in that a process failure (for example, air bubbles) resulting from the process of performing SVR or OCA occurs or a module related to the panel is damaged during the process. Moreover, if a polarization plate, etc. is attached using the filler, there is a disadvantage in that a rework process of detaching and attaching the polarization plate is impossible because of a work failure or mistakes when the module is assembled. Accordingly, the conventional method using the filler is problematic in that, if a work failure or mistakes are generated, all adhered products must be discarded because the rework process is impossible when the polarization plate is attached to the panel, etc. However, when the support member 130 constructed as above according to the present embodiments is used, the polarization plate 150, etc. adhered to the panel 110 can be easily removed although a rework problem occurs.

A comparison between a conventional method of attaching the polarization plate and a method of attaching the polarization plate according to the present embodiment is described below.

Figure 8:
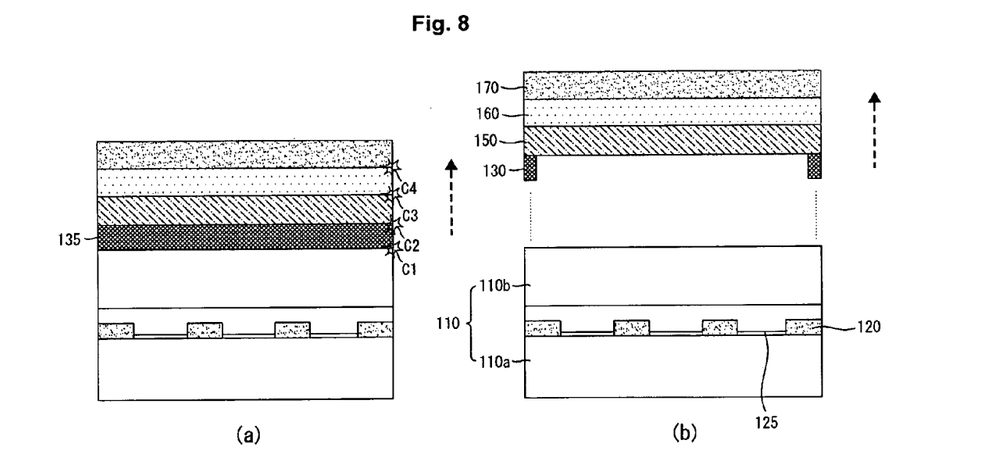
FIG. 8 is a diagram shown to compare a conventional method of adhering a polarization plate and a method of adhering a polarization plate according to an embodiment of this document.

Referring to (a) of FIG. 8, there is shown the conventional method using a filler 135. The conventional method using the filler 135 is problematic in that one or more of C1, C2, C3, and C4 are bitten off or ripped off when the polarization plate 150 is detached from the panel 110 in order to perform the rework process. This is because the panel 110 and the polarization plate 150 are strongly adhered together by the filler 135.

Referring to (b) of FIG. 8, there is shown the method using the support member 130 according to the embodiment of this document. In the method using the support member 130 according to the embodiment, the polarization plate 150 can be detached from the panel 110 using small force without the bite problem or the rip-off problem as in the conventional method in order to perform the rework process. This is because the area in which the panel 110 and the polarization plate 150 are adhered together is small.

If the air layer AG is formed using the support member 130 as in the embodiment when the polarization plate 150 is attached to the panel 110, reflected light generated from the air layer AG can be reduced.

A structure in which the polarization plate 150 is directly attached to the panel 110 and a structure in which the panel 110 and the polarization plate 150 are attached together with the air layer AG interposed therebetween are described below.

Figure 9:
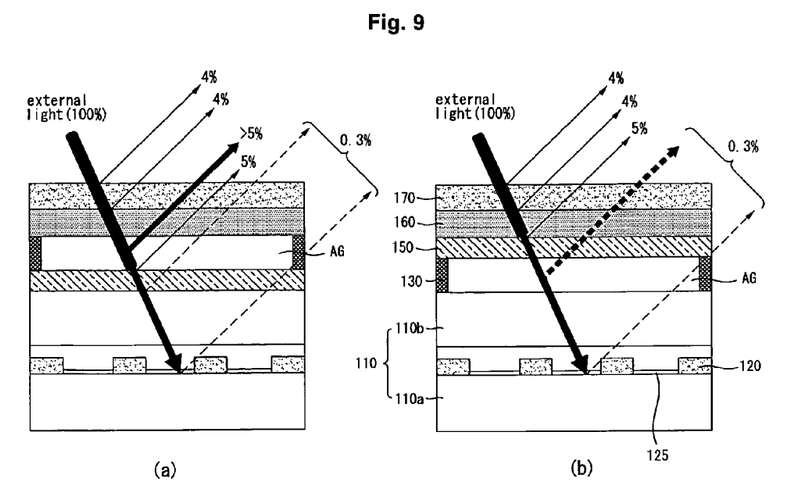
FIG. 9 is a diagram showing a difference in the reflectance according to a method of adhering the polarization plate.

(a) of FIG. 9 shows the structure in which the polarization plate 150 is directly attached to the panel 110, and (b) of FIG. 9 shows the structure in which the panel 110 and the polarization plate 150 are attached together with the air layer AG interposed therebetween. From FIG. 9, it can be seen that the air layer AG is formed both in (a) and (b) of FIG. 9, but the positions where the air layers AG are formed differ from each other. As a result of performing an experiment with the above structural difference, the reflectance between the two structures had the following difference as listed in Table.

TABLE

|  | LAYER | REFRACTIVE INDEX | REFLECTANCE | REMARKS |
| --- | --- | --- | --- | --- |
| Structure (a) | Cover window | ≈1.5 | ≈5% |  |
|  | Touch panel | ≈1.5 | ≈5% |  |
|  | Air layer | ≈1.0 | >5% |  |
|  | Polarization plate | ≈1.5 | ≈0.3% | Refringence of polarization plate ≈measured value 99.7% |
|  | Panel glass | ≈1.5 |  |  |
| Structure (b) | Cover window | ≈1.5 | ≈5% |  |
|  | Touch panel | ≈1.5 | ≈5% |  |
|  | Polarization plate | ≈1.5 | ≈0.3% |  |
|  | Air layer | ≈1.0 |  |  |
|  | Panel glass | ≈1.5 |  |  |

From the above table, it can be seen that the reflectance of the structure (a) is about 15.3%, whereas the reflectance of the structure (b) is about 10.3%. As can be seen from the table, if the polarization plate 150 is attached over the panel 110 using the structure according to the embodiment, reflectance can be improved. Accordingly, when the air layer AG is formed between the panel 110 and the polarization plate 150 using the structure according to the embodiment, reflectance can be improved. Consequently, the picture quality can be improved because an ambient contrast ratio (ACR) is improved. When the air layer AG is formed between the panel 110 and the polarization plate 150 as in the embodiments, the height of the air layer AG may range from 0.01 mm to 4.5 mm.

Figure 10:
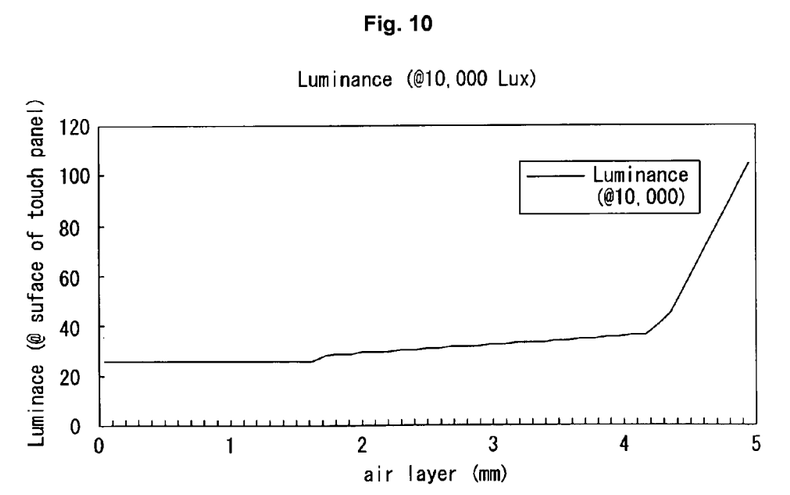
FIG. 10 is a graph showing the reflectance according to the height of an air layer.

A graph shown in FIG. 10 shows the measurement of light reflected in the touch panel 160 in the state of external light 10,000 Lux. From the graph, it can be seen that the reflected light increases toward the touch panel 160 according to the height of the air layer AG. From the graph, it can be seen that, when the air layer AG is formed between the panel 110 and the polarization plate 150 using the structure according to the embodiment, it is advantageous when the height of the air layer AG ranges from 0.01 mm to 4.5 mm.

In the above first to third embodiments, the examples in which the support member 130 is a double-sided adhesive member have been described. In the case of the structure according to the first embodiment, a support member having a double-sided adhesive property and having a pressure sensor included therein without the touch panel 160 may be used. Here, the pressure sensor may be an electrostatic capacitive-type pressure sensor made of insulating material formed between two electrodes and may be configured to detect a position touched by a user using a control unit configured to receive a change in the capacitance according to the pressure when the user touches the panel.

Meanwhile, a structure in which the air layer AG can be formed between the panel 110 and the polarization plate 150 as in the above embodiments is not limited to the above structures, but may be constructed as follows.

Fourth Embodiment

Figure 11:
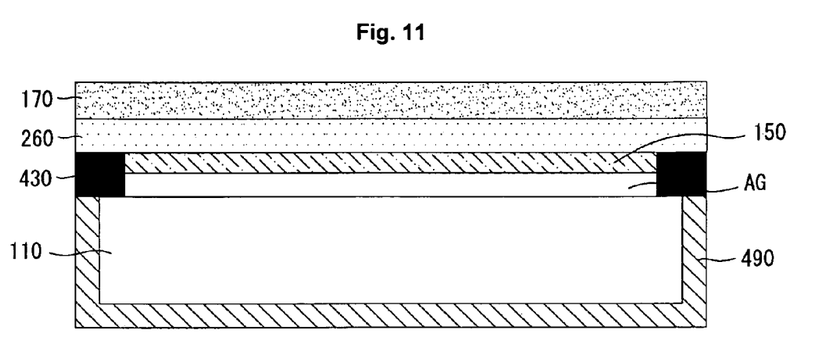
FIG. 11 is a cross-sectional view of an organic electroluminescent display device according to a fourth embodiment of this document.

Referring to FIG. 11, an organic electroluminescent display device according to a fourth embodiment of this document may comprise a panel 110, a frame 490 for accommodating the panel 110, a polarization plate 150, a touch panel 260, and a cover window 170. The panel 110, the polarization plate 150, the touch panel 260, and the cover window 170 may have the same constructions as described above, and a description thereof is omitted for simplicity.

In the fourth embodiment, when the air layer AG is formed between the panel 110 and the polarization plate 150, a support member 430 disposed between the touch panel 260 and the frame 490 for accommodating the panel 110 is used. The support member 430 may be attached in the form of a closed curve along the outer edge of the frame 490 and may be double-sided adhesive members configured to support a structure disposed over the polarization plate 150.

The support member 430 is configured to support a top surface of the frame 490 and the panel 110 and a bottom surface of the touch panel 260, thereby forming the air layer AG. In the present embodiment, in the case where the touch panel 260 is omitted, the support member 430 may support the cover window 170 instead of the touch panel 260, thereby forming the air layer AG. Meanwhile, the support member 430 used in the embodiment may be disposed in the form of a closed curve along the outer edge of the frame 490 (i.e., the form as shown in (a) of FIG. 7), but may be disposed in the form as shown in (b) or (c) of FIG. 7.

Fifth Embodiment

Figure 12:
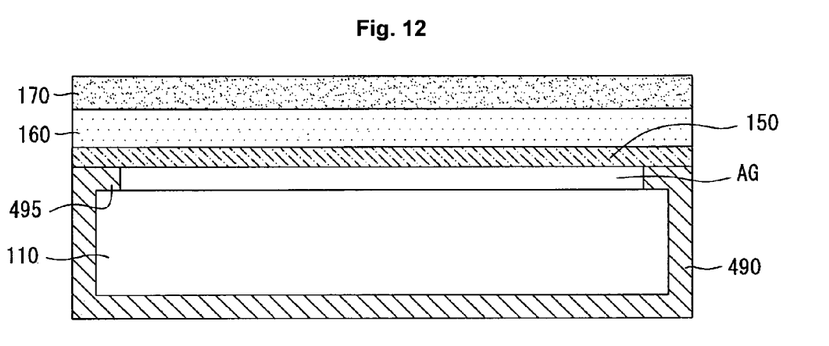
FIG. 12 is a cross-sectional view of an organic electroluminescent display device according to a fifth embodiment of this document.

Referring to FIG. 12, an organic electroluminescent display device according to a fifth embodiment of this document may comprise a panel 110, a frame 490 for accommodating the panel 110, a polarization plate 150, a touch panel 260, and a cover window 170. The panel 110, the polarization plate 150, the touch panel 260, and the cover window 170 may have the same constructions as described above, and a description thereof is omitted for simplicity.

In the fifth embodiment, when an air layer AG is formed between the panel 110 and the polarization plate 150, the structure of the frame 490 for accommodating the panel 110 is taken advantage of. In this structure, a support member 495 configured to form the air layer AG between the panel 110 and the polarization plate 150 may have a structure configured to protrude from the frame 490 and bent in such a way as to cover some of the panel 110. At least one side of the support member 495 integrally formed with the frame 490 may not be bent so that the panel 110 does not slide into the frame 490. If the air layer AG is formed using the structure of the frame 490 as described above, the polarization plate 150 may be seated in the support member 495 formed in the frame 490. Meanwhile, since the seated polarization plate 150, etc. may be deviated from the support member 495, the support member 495 and the polarization plate 150 seated in the frame 490 may be attached using a double-sided adhesive, or the polarization plate 150 may be attached to the support member 495 using an adhesive member.

Sixth Embodiment

Figure 13:
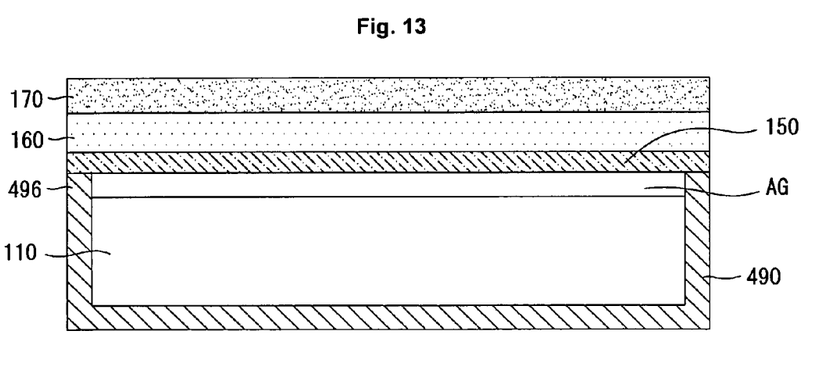
FIG. 13 is a cross-sectional view of an organic electroluminescent display device according to a sixth embodiment of this document.

Referring to FIG. 13, an organic electroluminescent display device according to a sixth embodiment of this document may comprise a panel 110, a frame 490 for accommodating the panel 110, a polarization plate 150, a touch panel 260, and a cover window 170. The panel 110, the polarization plate 150, the touch panel 260, and the cover window 170 may have the same constructions as described above, and a description thereof is omitted for simplicity.

In the sixth embodiment, when an air layer AG is formed between the panel 110 and the polarization plate 150, the structure of the frame 490 for accommodating the panel 110 is taken advantage of. In this structure, a support member 496 configured to form the air layer AG between the panel 110 and the polarization plate 150 may have a structure protruding from the frame 490. If the air layer AG is formed using the structure of the frame 490 as described above, the polarization plate 150 may be seated in the support member 496 formed in the frame 490. Meanwhile, since the seated polarization plate 150, etc. may be deviated from the support member 496, the support member 496 and the polarization plate 150 seated in the frame 490 may be attached using a double-sided adhesive, or the polarization plate 150 may be attached to the support member 496 using an adhesive member.

The structures of the fourth to sixth embodiments may have a better effect than the conventional method using the filler from all aspects as in the first to third embodiments. Further, the structures using the frame 490 as in the fourth to sixth embodiments may be designed so that the height of the air layer AG ranges from 0.01 mm to 4.5 mm as described above in connection with the experimental data.

According to the embodiments of this document, when a module is assembled, a rework process can be facilitated, reflectance can be reduced, and the picture quality can be enhanced according to an improved ACR.

The foregoing embodiments and advantages are merely exemplary and are not to be construed as limiting this document. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. An organic electroluminescent display device, comprising:
    a panel;
    a polarization plate disposed over the panel;
    a touch panel disposed on the polarization plate;
    a cover window disposed on the touch panel;
    a support member configured to form an air layer between the panel and the polarization plate; and
    a frame for accommodating the panel,
    wherein the frame comprises a protrude support member protrude from the frame and supports an outer edge of the polarization plate,
    wherein the protrude support member has a structure configured to protrude from the frame and bent in such a way as to cover some of the panel,
    wherein a height of the air layer ranges from 0.01 mm to 4.5 mm,
    wherein the frame and the protrude support member are formed as one body.

2. The organic electroluminescent display device of claim 1, wherein the polarization plate comprises:
    a phase delay film disposed over the panel; and
    a polarization film disposed on the phase delay film.

* * * * *